United States Patent [19]

Morse

[11] 4,064,464
[45] Dec. 20, 1977

[54] AMPLITUDE STABILIZED POWER AMPLIFIER

[75] Inventor: Alfred W. Morse, Baltimore, Md.

[73] Assignee: Westinghouse Electric Corporation, Pittsburgh, Pa.

[21] Appl. No.: 676,450

[22] Filed: Apr. 13, 1976

[51] Int. Cl.² ........................... H03F 3/60; H03F 3/68
[52] U.S. Cl. .................................. 330/53; 330/124 R
[58] Field of Search .................. 330/29, 30 R, 53, 84, 330/124 R, 127, 129, 149; 328/175; 333/17 L; 332/37 D

[56] References Cited

U.S. PATENT DOCUMENTS

| | | | |
|---|---|---|---|
| 2,808,569 | 10/1957 | Morrison | 332/37 D |
| 3,248,663 | 4/1966 | Jacob | 330/124 R |
| 3,711,782 | 1/1973 | Perrero et al. | 330/30 R |
| 3,909,742 | 9/1975 | Cox et al. | 330/124 R X |
| 4,010,426 | 3/1977 | Rambo | 330/53 |

Primary Examiner—James B. Mullins
Attorney, Agent, or Firm—H. W. Patterson

[57] ABSTRACT

An amplitude stabilized power amplifier having a power splitter for dividing the power of an input signal into a predetermined number of channels, a plurality of amplifier modules for amplifying the power of each of the channels divided by the power splitter, and a power combiner for combining the amplified power signals to provide an amplified output signal. One of the channels of the power splitter is provided with a voltage controlled phase shifter whose phase shift is controlled by an operational amplifier which is responsive to a reference voltage and to the amplified output signal of the power combiner such that the signal in the channel provided with the phase shifter operates to limit the efficiency of the power combiner to maintain a power combiner output signal of constant power with respect to the reference voltage.

8 Claims, 2 Drawing Figures

AMPLITUDE STABILIZED POWER AMPLIFIER

BACKGROUND OF THE INVENTION

1. Field of the Invention

The present invention relates to power amplifiers and, more particularly, to mechanizations for providing amplitude stabilization for such power amplifiers.

2. Description of the Prior Art

In the prior art, solid state power amplifiers have evidenced characteristic decreases in amplitude over the course of the sustained amplification of an input signal. This characteristic decline in amplitude, which is commonly referred to as amplitude droop, occurs as the result of temperature increases of the amplifier components and the finite capacitance and regulatory capabilities of the amplifier power supply voltage. Amplitude droop in pulsed amplifiers is known to produce undesirable effects. For example, amplitude droop in a driver amplifier provides a variable drive power to the next stage which causes phase modulation and associated spurious outputs. In another example, amplitude droop in the final power amplifier of a transmitter degrades the pulse compression properties of both wide band chirped radars and Barker coded systems.

In the prior art, there has been no way to eliminate the temperature effects in amplifiers due to the self-heating of the amplifier components. Prior art systems directed to the correction of amplitude droop caused by the finite capacitance and regulation of the amplifier supply voltage have involved large amounts of storage capacitance and complicated, stiff power supply systems. Heretofore, feedback type control systems have not generally been used since the amplifiers typically operate in saturated regions where they are unresponsive to output variations in a feedback loop. The presently disclosed amplitude stabilized power amplifier satisfies the need for a power amplifier which is not subject to amplitude droop caused by the self-heating of the amplifier components and also satisfies the need for a power amplifier which is not dependent on large storage capacitance and complicated, unresponsive power supply systems to diminish the impact of the finite capacitance and regulation of the amplifier power supply.

SUMMARY OF THE INVENTION

In accordance with the present invention, a power splitter divides an input signal among a plurality of amplification channels, each having a power amplifier module. The separately amplified signals of the power channels are then recombined in a power combiner to provide the amplified power output signal. One of the power channels is also provided with a voltage controlled phase shifter whose phase shift is controlled by an operational amplifier which is responsive to a reference voltage and also responsive to the power level of the amplified power output signal. The control amplifier controls the phase shift of the voltage controlled phase shifter such that when the power of the power amplifier output signal exceeds a predetermined level, the operational amplifier causes the phase shifter to change the phase of the signal in its amplification channel. By this phase shift the phase shifter affects the power combining efficiency of the power combiner to maintain the power of the power amplifier output signal at the predetermined level.

DESCRIPTION OF THE PREFERRED EMBODIMENT

Figure 1:
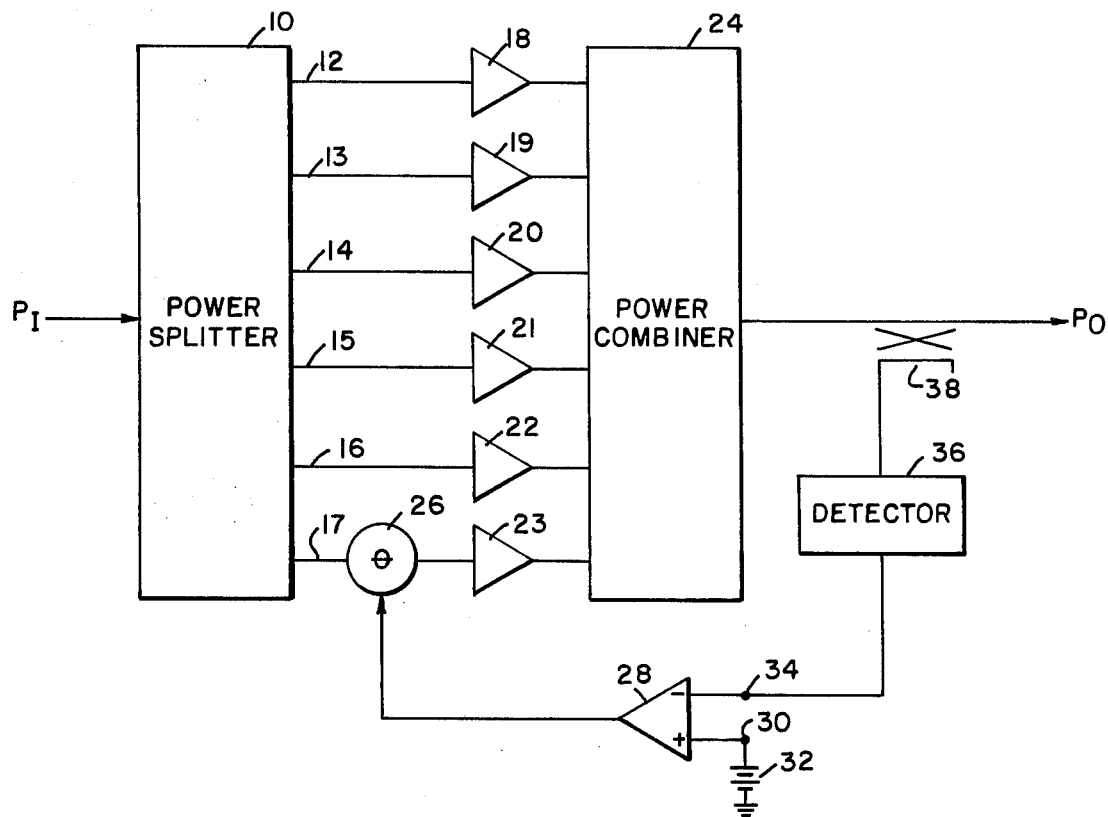
FIG. 1 is a block diagram of a preferred embodiment of the amplitude stabilized amplifier and FIG. 2 is an illustration of the output power of an unstabilized amplifier contrasted with the stabilized output power of the disclosed amplifier of the present invention.

As shown in FIG. 1, in the preferred embodiment of the invention the amplitude stabilized power amplifier includes a power splitter 10 which is responsive to an input signal $P_I$ and which divides the input power $P_I$ into output channels 12, 13, 14, 15 and 16, 17 which supply six amplifier modules 18, 19, 20, 21, 22 and 23 with a signal having a power level of $P_{I/6}$. The outputs of the amplifier modules 18 through 23 are combined in a power combiner 24 to provide the amplified power output signal $P_o$. Devices such as power splitter 10 and power combiner 24 are well known in the art and are described in an article entitled "An N-Way Hybrid Power Divider" by E. J. Wilkinson which appeared at pages 116-118 of the January 1960 publication of IRE transactions on microwave theory and techniques. The particular amplifier which would comprise amplifier modules 18 through 23 would depend upon the bandwidth, power level and frequency for which the amplifier is designed. As will be recognized by those skilled in the pertinent art, the above-described apparatus comprises a conventional high power modular amplifier. Accordingly, although the preferred embodiment employs six parallel disposed amplifier modules 18 through 23, it will be recognized that other numbers of modules may equivalently be used.

As also shown in FIG. 1, the amplifier module 23 is provided with a voltage controlled phase shifter 26 whose control signal is supplied by an operational amplifier 28 having a first input terminal 30 connected to a voltage source 32 and having a second input terminal 34 responsive to the power output signal $P_o$ of the power combiner 24 through a detector 36 and a directional coupler 38. Typically, phase shifter 26 could be comprised of Lorch Electronics Corporation Model TQ-28, and detector 36 could be comprised of Omni Spectra Incorporated Model 20090.

Figure 2:
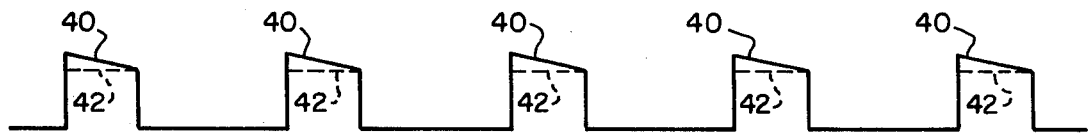

As known in the art, the amplitude droop of the unstabilized power amplifier comprised of the power splitter 10; the amplifier modules 18, 19, 20, 21, 22 and 23; and the power combiner 24 is determined by the amplitude droop characteristics of the individual amplifier modules since the power combiner 24 is a linear addition network. This characteristic amplitude droop is illustrated in FIG. 2 as the solid line 40. In accordance with the present invention, the phase shifter 26, as controlled by the amplifier 28, in combination with the power splitter 10, the power amplifier modules 18, 19, 20, 21, 22 and 23 and power combiner 24 provides an amplitude stabilized power amplifier which produces an amplitude stabilized output voltage as illustrated in FIG. 2 by the dashed line 42. As known in the art, the overall droop in the power amplifier is determined by the linear combination of the droop characteristics of the individual amplifier modules 18, 19, 20, 21, 22 and 23 in the power combiner 24. The phase angle of the amplifier module 23 that is operative with the phase shifter 26 affects the power combining efficiency of the power combiner 24 and, therefore, also affects the net output power of the power amplifier. This output power may be expressed by the equation $$P_o = P_m/N \, [[(N-1) + \cos \theta]^2 + \sin^2 \theta]$$

where:

$P_m$ is the power of each amplifier module;

$N$ is the total number of amplifier modules; and $\theta$ is the phase of the phase controlled module relative to the other modules.

In the operation of the preferred embodiment of the present invention, the reference voltage 32 is provided to terminal 30 of the operational amplifier 28 and a representative sample of the output power signal $P_o$ is provided through the directional coupler 38 to the detector 36. The detector 36 provides a voltage to terminal 34 of the operational amplifier 28 which is indicative of the power level of $P_o$, the output of the power combiner 24. When the voltages applied to the terminals 30 and 34 are equal, the operational amplifier 28 produces no output signal. However, when an imbalance between the voltage applied to the terminals 30 and 34 appears, the operational amplifier 28 provides an output signal to the voltage controlled phase shifter 26. Therefore, if the signal from the detector 36 corresponding to the output power $P_o$ exceeds the amplitude of the reference voltage 32, the operational amplifier 28 will provide a signal to the voltage controlled phase shifter 26. The output signal of the control amplifier 28 is of a sense so as to cause the phase shifter 26 to shift the phase of the $P_{I/6}$ power signal provided to the amplifier module 23 with respect to the phase of amplifier modules 18, 19, 20, 21 and 22, such that, in accordance with the above equation, the output power $P_o$ remains substantially constant relative to the reference voltage 32. As can be seen from FIG. 2, in practice, this phase shift induced into the $P_{I/6}$ power signal provided to amplifier module 23 is at a maximum at the beginning of an output pulse and decreases in magnitude over the duration of the pulse. Thus, the stabilized amplifier herein disclosed, although moderately reducing the net amplifier power, provides a substantially constant power output level. As the output amplitude tends to droop over the duration of the pulse, the feedback voltage provided by the directional coupler 38 and the detector 36 is compared with the reference voltage 32 by the operational or control amplifier 28 to reduce the phase shift of the phase shifter 26 and maintain the power output $P_o$ at a substantially constant level.

It will be apparent that the presently disclosed invention may control the amplitude of any multimodule or multitransistor amplifier. It will be particularly effective in solid state transmitters which provide pulses having a long pulse width and is applicable to continuous wave as well as pulse systems. The invention also admits to the use of amplifiers which employ small, light, inexpensive power supplies since it does not rely on the regulation and storage capabilities of the power supply to provide amplitude stability. Since the stabilization of the amplifier output $P_o$ is not dependent on the gain or linearity of the amplifier modules, the amplifier modules may be comprised of saturated, Class C amplifiers.

I claim:

1. An amplitude stabilized power amplifier comprising:

a power splitter for splitting the power of an input signal into a predetermined number of channels;

a phase shifter that is responsive to the power signal of one of said channels for controlling the phase angle characteristic of the power signal of said one channel;

a plurality of amplifiers for amplifying the power signal of each of the channels of the power splitter;

a power combiner for combining the amplified signals of the channels to provide a power amplified output signal;

means to generate a first signal representative of the power level of the amplified output signal of the power combiner;

means to generate a second signal representative of a predetermined power level independent of the input; and means governed by the first and second signals for continuously controlling the power signal phase shift provided by said phase shifter by shifting the phase angle characteristic of the power signal of said one channel with respect to the phase angle characteristic of the power signal of another channel with a magnitude in proportion to the difference between the first and second signals such that the power level of the power amplified output signal remains substantially constant.

2. The apparatus claimed in claim 1 wherein the first signal generating means comprises:

a directional coupler for providing a power signal in response to the level of the power amplified output signal of said combiner;

a detector for converting the power signal of said directional coupler to a voltage signal;

wherein the second signal is a reference voltage representative of a predetermined power level; and wherein the controlling means is an operational amplifier for continuously controlling the phase of said phase shifter in response to the voltage signal of said detector and in response to said reference voltage.

3. The power amplifier of claim 1 wherein said plurality of amplifiers operate in their saturated region.

4. A method for stabilizing the amplitude of a power amplifier, said method comprising:

splitting the power of an input signal into a predetermined number of channels;

shifting the phase angle characteristic of the power signal of one of the channels with respect to the phase angle of the power signal of another channel;

amplifying the power signal of each of the channels;

combining the amplified signals of the channels to provide a power amplified output signal;

generating a first signal representative of the power level of the power amplified output signal;

generating a second signal representative of a predetermined power level independent of the input signal; and continuously controlling the phase shift of the power signal of said one channel to, at times, shift the phase angle of the power signal of said one channel with respect to the phase angle of the power signal of another channel with a magnitude in proportion to the difference between the first and second signals thereby limiting the efficiency of the combination of the amplified signals such that the power level of the power amplified output signal remains substantially constant.

5. An amplitude stabilized power amplifier comprising:

a power splitter for dividing the power of an input signal in substantially equal proportions between a predetermined number of channels;

a phase shifter that is responsive to the power signal of one of said channels, said phase shifter being operative to shift only the phase characteristic of the power signal of said one channel;

a plurality of amplifiers for amplifying the power signal of each of the channels of the power splitter;

a power combiner for combining the amplified power signals of the channels to provide a power amplified output signal;

means to generate a first signal representative of the power level of the power amplified output signal;

means to generate a second signal representative of a predetermined power level independent of the input signal; and means governed by the first and second signals for continuously controlling the efficiency of said power combiner by causing said phase shifter to shift only the phase angle characteristic of the power signal of said one channel with respect to the phase angle characteristic of the power signal of another channel with a magnitude in proportion to the difference between the first and second signals such that the power level of the power amplified output signal remains substantially constant.

6. The power amplifier of claim 5 wherein said plurality of amplifiers operate in their saturated region.

7. The power amplifier of claim 5 wherein said first signal generating means comprises:

a directional coupler for providing a power signal in response to the power amplified output signal of said combiner;

a detector for converting the power signal of said directional coupler to a voltage signal;

wherein the second signal is a reference voltage signal representative of a predetermined power level; and wherein the controlling means is an operational amplifier for continuously shifting only the phase angle characteristic of the power signal of said one channel by controlling only the phase shift of said phase shifter in response to the voltage signal of said detector and in response to said reference voltage.

8. A method for stabilizing the amplitude of a power amplifier, said method comprising:

splitting the power of an input signal in substantially equal proportions between a predetermined number of channels;

shifting only the phase angle characteristic of the power signal of only one of the channels;

amplifying the signal of each of the channels at the amplifying saturation level;

combining the amplified signals of the channels to provide a power amplified output signal;

generating a first signal representative of the power level of the power amplified output signal;

generating a second signal representative of a predetermined power level independent of the input; and continuously controlling the efficiency of combining the amplified signals by shifting the phase angle of the power signal of said one channel with respect to the phase angle of the power signal of another channel with a magnitude in proportion to the difference between the first and second signals such that the power level of the power amplified output signal remains substantially constant.

* * * * *